(12) United States Patent
Yang et al.

(10) Patent No.: US 9,331,196 B2
(45) Date of Patent: May 3, 2016

(54) SEMICONDUCTOR DEVICE

(71) Applicant: Nuvoton Technology Corporation, Hsinchu (TW)

(72) Inventors: Shao-Ming Yang, Hsinchu (TW); Gene Sheu, Hsinchu (TW); Antonius Fran Yannu Pramudyo, Hsinchu (TW); Erry Dwi Kurniawan, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 14/504,431

(22) Filed: Oct. 2, 2014

(65) Prior Publication Data

US 2016/0099346 A1 Apr. 7, 2016

(51) Int. Cl.
| | |
|---|---|
| H01L 29/66 | (2006.01) |
| H01L 29/78 | (2006.01) |
| H01L 29/10 | (2006.01) |
| H01L 29/08 | (2006.01) |
| H01L 29/06 | (2006.01) |
| H01L 29/423 | (2006.01) |

(52) U.S. Cl.
CPC ........ *H01L 29/7816* (2013.01); *H01L 29/0611* (2013.01); *H01L 29/0649* (2013.01); *H01L 29/0865* (2013.01); *H01L 29/0882* (2013.01); *H01L 29/1095* (2013.01); *H01L 29/42356* (2013.01)

(58) Field of Classification Search
None
See application file for complete search history.

(56) References Cited

U.S. PATENT DOCUMENTS

| | | | | | |
|---|---|---|---|---|---|
| 6,380,566 | B1* | 4/2002 | Matsudai | ............ | H01L 29/7816 257/133 |
| 7,964,485 | B1* | 6/2011 | French | ................ | H01L 21/2253 438/548 |
| 2002/0030225 | A1* | 3/2002 | Nakamura | .......... | H01L 29/0615 257/338 |
| 2005/0067653 | A1* | 3/2005 | Litwin | ................ | H01L 29/7809 257/335 |
| 2009/0114987 | A1* | 5/2009 | Tanaka | ............ | H01L 21/823418 257/335 |
| 2009/0242981 | A1* | 10/2009 | Fujita | .................. | H01L 29/0696 257/335 |
| 2009/0315113 | A1* | 12/2009 | Vashchenko | ........ | H01L 27/0262 257/355 |
| 2011/0127602 | A1* | 6/2011 | Mallikarjunaswamy | .................. | H01L 21/823807 257/331 |
| 2011/0215402 | A1* | 9/2011 | Lee | ....................... | H01L 29/063 257/335 |

OTHER PUBLICATIONS

Contiero et al., "Characteristics and Applications of a 0.6 μm Bipolar-CMOS-DMOS Technology combining VLSI Non-Volatile Memories," International Electron Devices Meeting, 1996, pp. 465-468.

Merchant et al., "Robust 80 V LDMOS and 100 V DECMOS in a Streamlined SOI Technology for Analog Power Applications," Proceedings of the 14th International Symposium on Power Semiconductor Devices and ICs, 2002, pp. 185-188.

(Continued)

*Primary Examiner* — Benjamin Sandvik
*Assistant Examiner* — Herve Assouman
(74) *Attorney, Agent, or Firm* — Jianq Chyun IP Office

(57) ABSTRACT

A semiconductor device including a gate structure, a source region, a drain region, a first conductive type epitaxial layer, a high voltage second conductive type well, a linear graded high voltage first conductive type well and a first conductive type buried layer is provided. The first conductive type buried layer is located within the first conductive type epitaxial layer and below the high voltage second conductive type well, and a length of the first conductive type buried layer is smaller than a length of the high voltage second conductive type well.

20 Claims, 3 Drawing Sheets

(56) References Cited

OTHER PUBLICATIONS

Jacob A. et al., "A-BCD: An economic 100 V RESURF silicon-on-insulator BCD technology for consumer and automotive applications," The 12th International Symposium on Power Semiconductor Devices and ICs, May 22, 2000-May 25, 2000, pp. 327-330.

Kawai et al., "Multi-Voltage SOI-BiCDMOS for 14V&42V Automotive Applications," The 16th International Symposium on Power Semiconductor Devices and ICs, May 24-27, 2004, pp. 165-168.

Inaba et al., "A high reliability and low loss 3-phase gate driver IC with a novel soft gate drive circuit for 42V motor generator system," 15th International Symposium on Power Semiconductor Devices and ICs, Apr. 2003, pp. 97-100.

Philip L. Hower, "Safe operating area—a new frontier in Ldmos design," 14th International Symposium on Power Semiconductor Devices and ICs, 2002, pp. 1-8.

Ko et al., "Implementation of 85V High Side LDMOS with n-layer in a 0.35um BCD Process," 20th International Symposium on Power Semiconductor Devices and IC's, May 18-22, 2008, pp. 103-106.

Sung et al., "High-side N-channel LDMOS for a High Breakdown Voltage," Journal of the Korean Physical Society, vol. 58, No. 5, May 2011, pp. 1411-1416.

Wasisto et al., "A novel 800V multiple RESURF LDMOS utilizing linear p-top rings," IEEE Region 10 Conference, Nov. 21-24, 2010, pp. 75-79.

* cited by examiner

SEMICONDUCTOR DEVICE

BACKGROUND OF THE INVENTION

1. Field of the Invention

The present invention generally relates to a semiconductor device, in particular, to a lateral double-diffused metal oxide semiconductor (LDMOS) device.

2. Description of Related Art

Recently, LDMOS devices such as high voltage LDMOS device have attracted great deal of attention owing to their CMOS compatibility and high speed switching capability, as well as their prospective applications in the consumer electronics. To further broaden the applicability of LDMOS devices, it is necessary to enhance the electrical performances, such as a robust breakdown voltage, a low on-resistance (Ron), and a high current-driving capability.

SUMMARY OF THE INVENTION

The embodiments of the invention provide a semiconductor device including a first conductive type epitaxial layer, a high voltage second conductive type well, a first conductive type buried layer, a source region, a linear graded high voltage first conductive type well, a drain region and a gate structure. The first conductive type epitaxial layer is disposed on a second conductive type substrate. The high voltage second conductive type well is disposed within the first conductive type epitaxial layer. A first conductive type buried layer is disposed within the first conductive type epitaxial layer and below the high voltage second conductive type well, wherein a length of the first conductive type buried layer is smaller than a length of the high voltage second conductive type well. The source region is disposed within the high voltage second conductive type well. The linear graded high voltage first conductive type well is disposed within the first conductive type epitaxial layer. The drain region is disposed within the linear graded high voltage first conductive type well. The gate structure is disposed above the first conductive type epitaxial layer and disposed between the source region and the drain region.

The embodiments of the invention provides a semiconductor device, comprising a first conductive type epitaxial layer, a high voltage second conductive type well, a first conductive type buried layer, a source region, a drain region, a gate structure and a linear graded high voltage first conductive type well. The first conductive type epitaxial layer is disposed on a second conductive type substrate. The high voltage second conductive type well is disposed within the first conductive type epitaxial layer. The first conductive type buried layer is disposed within the first conductive type epitaxial layer and below the high voltage second conductive type well. A length of the first conductive type buried layer is around three fourth of a length of the high voltage second conductive type well. The source region is disposed within the high voltage second conductive type well. The linear graded high voltage first conductive type well is disposed within the first conductive type epitaxial layer. The drain region is disposed within the linear graded high voltage first conductive type well. The gate structure is disposed above the first conductive type epitaxial layer and disposed between the source region and the drain region.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
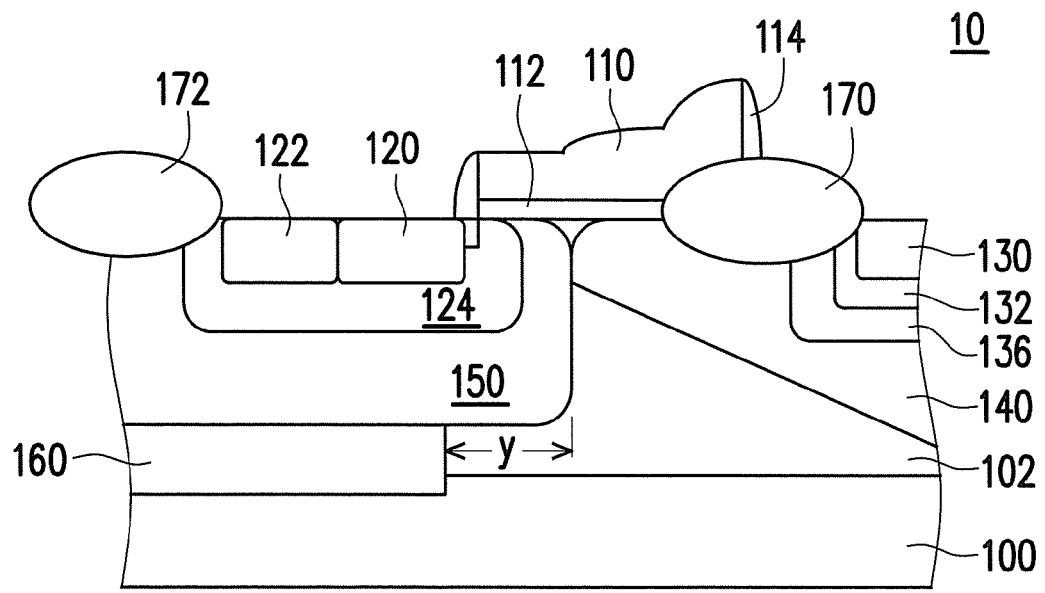
FIG. 1 is a schematic cross-sectional diagram of a semiconductor device according to an embodiment of the invention.

When the n-channel LDMOS (NLDMOS) is operated in a high-side mode, the source voltage is raised over the substrate voltage, because the source is connected to the load of the next stage. In order to resolve this electrical isolation problem, an N-type (such as n+) buried layer (NBL) is arranged beneath the source region, which prevents the punch-through phenomenon between the source and the substrate. However, it is discovered that the NBL tends to limit the breakdown voltage, because the high doping concentration of the NBL drives out the extension of the depletion region. Concerning this limitation, the silicon-on-insulator (SOI) substrate is utilized for implementing the LDMOS devices at the voltage up to 80 V. However, the SOI process has shortcomings, such as high production cost and high power consumption.

Accordingly, the present embodiments of the invention is directed to a low cost and high performance high-side NLDMOS device capable of preventing the breakdown between a source and a substrate when the device is in on-state, and making the electric potential wires evenly distribute at a source terminal and a drain terminal when the device is in off-state, so as to achieve desirable breakdown voltage and the lowest possible Ron with acceptable isolation voltage.

Reference will now be made in detail to the present embodiments of the invention, examples of which are illustrated in the accompanying drawings. Wherever possible, the same reference numbers are used in the drawings and the description to refer to the same or like parts. In the following embodiments, the NLDMOS device is described as an example for illustration. In other words, the LDMOS device is illustrated using an N-type epitaxial (N-epi) layer, a P-type substrate, a linear graded high voltage N-type well (HVNW), a high voltage P-type well (HVPW) and an N-type buried layer (NBL). However, it is not intended to limit the device structure by the exemplary embodiments described herein. Such design can also be applied to the p-channel lateral double-diffused metal oxide semiconductor (PLDMOS) device or other semiconductor device. That is, the present invention can also be suitable for a LDMOS having a P-type epitaxial (P-epi) layer, an N-type substrate, a linear graded high voltage P-type well (HVPW), a high voltage N-type well (HVNW) and a P-type buried layer (PBL).

FIG. 1 is a schematic cross-sectional diagram of an NLDMOS device according to an embodiment of the invention. Referring to FIG. 1, the structure of the NLDMOS device 10 includes a gate 110, a source region 120, a drain region 130, a linear graded high voltage N-type well (HVNW) 140, a high voltage P-type well (HVPW) 150 and an N-type buried layer (NBL) 160. The NLDMOS device 10 further includes an N-type epitaxial (N-epi) layer 102 and a P-type substrate 100. The P-type dopant may be ions of group IIIA, including boron ions, while the N-type dopant may be ions of group VA, including arsenic ions or phosphorous ions. The N-epi layer 102 may be formed by epitaxial growth or implantation, for example. The NLDMOS device 10 may be a high-side NLDMOS device, for example. The HVPW 150 and the linear graded HVNW 140 are located in the N-type epitaxial layer 102 and can be adjacent to each other. The junctions of the HVPW 150 may be in direct contact with that of the linear graded HVNW 140.

Referring to FIG. 1, the gate 110 is located between the source region 120 and the drain region 130 and a part of the gate 110 is located between the isolation structures 170 and 172. That is, a portion of the gate 110 may be extended over the isolation structure 170. The source and drain regions 120, 130 may be N-type heavily doped region (N+ regions) and the isolation structures 170, 172 may be field oxide structures, for example. The gate 110 extends over the HVPW 150 and the linear graded HVNW 140. The gate 110 can be formed as a stacking layer of one or more conductive materials, including undoped polysilicon, doped polysilicon, polysilicide, metal or a combination thereof. A gate dielectric layer 112 is located between the gate 110 and the P-type substrate 100. The gate dielectric layer 112 may be made of silicon oxide or any other suitable material, for example. For example, the gate dielectric layer 112 as described in this embodiment may be formed by a single oxidation process step and will be referred as single-step gate oxide layer for being an oxide layer having a uniform thickness. The gate 110 and the gate dielectric layer 112 may be composed of a gate structure.

The source region 120 and a P-type heavily doped region (P+ region) 122 are disposed within a P-type body 124, and the P-type body 124 is located within the HVPW 150. The isolation structure 172 is located above the P-type body 124 and the HVPW 150 and adjacent to the P+ region 122.

The drain region 130 is located within the N-type highly-doped drain (HDD) region 132 and the N-type HDD region 132 can be located within an N-type well 136. The N-type well 136 is located within the linear graded HVNW 140. Although only one gate structure is illustrated in the exemplary figure, it is understood that multiple gate structures in multiple devices may be formed. The drain region 130, the N-type HDD region 132 and the N-type well 136 are located between two gate structures of two devices. The isolation structure 170 includes an upper portion and a lower portion. The upper portion is located above the linear graded HVNW 140, and the lower portion is located within the linear graded HVNW 140. In addition, the isolation structure 170 is located above the N-type HDD region 132 and the N-type well 136 and adjacent to the drain region 130. The N-type well 136 may be an N-type drift (N-drift) region, for example. The isolation structures 170, 172 may be field oxide layers, for example.

The NBL 160 may be an N-type heavily doped buried layer, and one part of the NBL 160 is located within the N-type epitaxial layer 102 and below the HVPW 150. More particularly, the other part of the NBL 160 may be located within the P-type substrate 100, and the NBL 160 is in contact with the HVPW 150. In another embodiment, the NBL 160 is located within the N-type epitaxial layer 102 and is in contact with the HVPW 150 and the P-type substrate 100. According to an embodiment of the invention, the length of the NBL 160 is smaller than the full length of the HVPW 150. In other words, one side of the NBL 160 is aligned with one side of the HVPW 150, and the other side of the NBL 160 is pulled back. The NBL 160 is pulled back with a pull-back length y.

The linear graded HVNW 140 is located within the N-type epitaxial layer 102 and adjacent to the HVPW 150. In the present embodiment, the linear graded HVNW 140 is a doped region having a lateral linear doping profile that gradually becomes deeper (increased depth from the semiconductor device surface) from the location nearest the HVPW 150 to the location farther from the HVPW 150. In other words, the doping profile of the linear graded HVNW 140 has a linear gradient. In an embodiment, the depth of the linear graded HVNW 140 at the location nearest the HVPW 150 may be 0.5 μm+0.2 μm, and the depth of the linear graded HVNW 140 at the location farther from the HVPW 150 (near the drain region 130) may be 1.5 μm±0.5 μm, for example. For the linear graded HVNW 140, the side with a smaller depth has a lower concentration, while the side with a larger depth has a higher concentration.

Figure 2:
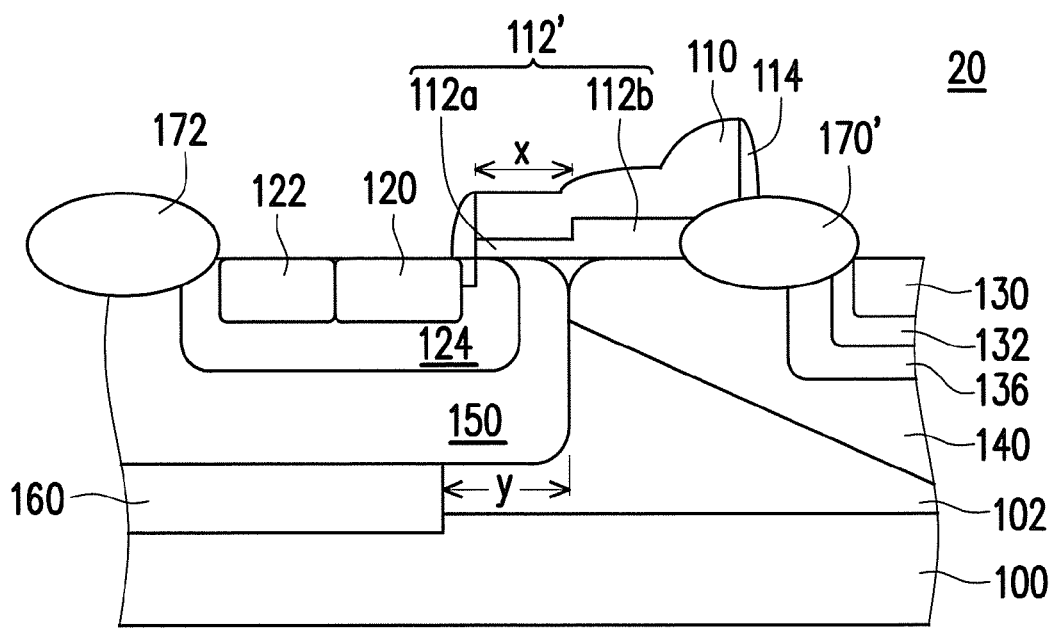
FIG. 2 is a schematic cross-sectional diagram of a semiconductor device according to another embodiment of the invention.

FIG. 2 is a schematic cross-sectional diagram of an NLDMOS device according to another embodiment of the invention. Referring to FIG. 2, an NLDMOS device 20 was similar to the NLDMOS device 10 of FIG. 1 and similar layers or regions will be labelled with the same reference numbers for the purposes of illustration. The NLDMOS device 20 also includes a gate 110, a source region 120, a drain region 130, a linear graded HVNW 140, a HVPW 150 and an NBL 160. According to this embodiment, the gate dielectric layer 112' as described in this embodiment may be formed by dual or two oxidation process steps and will be referred as two-step gate oxide layer for being an oxide layer having different thickness at two different locations. As shown in FIG. 2, the gate dielectric layer 112' includes a first region 112a and a second region 112b. The first region 112a has a smaller thickness (i.e. thinner) and a length x and the second region 112b has a larger thickness (i.e. thicker). The first region 112a may be located above the P-type body 124 and HVPW 150 and near the source region 120, while the second region 112b may be located above the linear graded HVNW 140 and near the isolation structure 170' and the drain region 130.

Compared with the NLDMOS device 10 of FIG. 1, the length of two-step gate oxide layer may be larger than the length of the single-step gate oxide layer as the length of the field oxide 170' (FIG. 2) adjacent to the gate dielectric layer 112' is reduced toward the drain region 130. The manufacturing process of the NLDMOS 20 will be briefly described in the following paragraphs.

Figure 3:
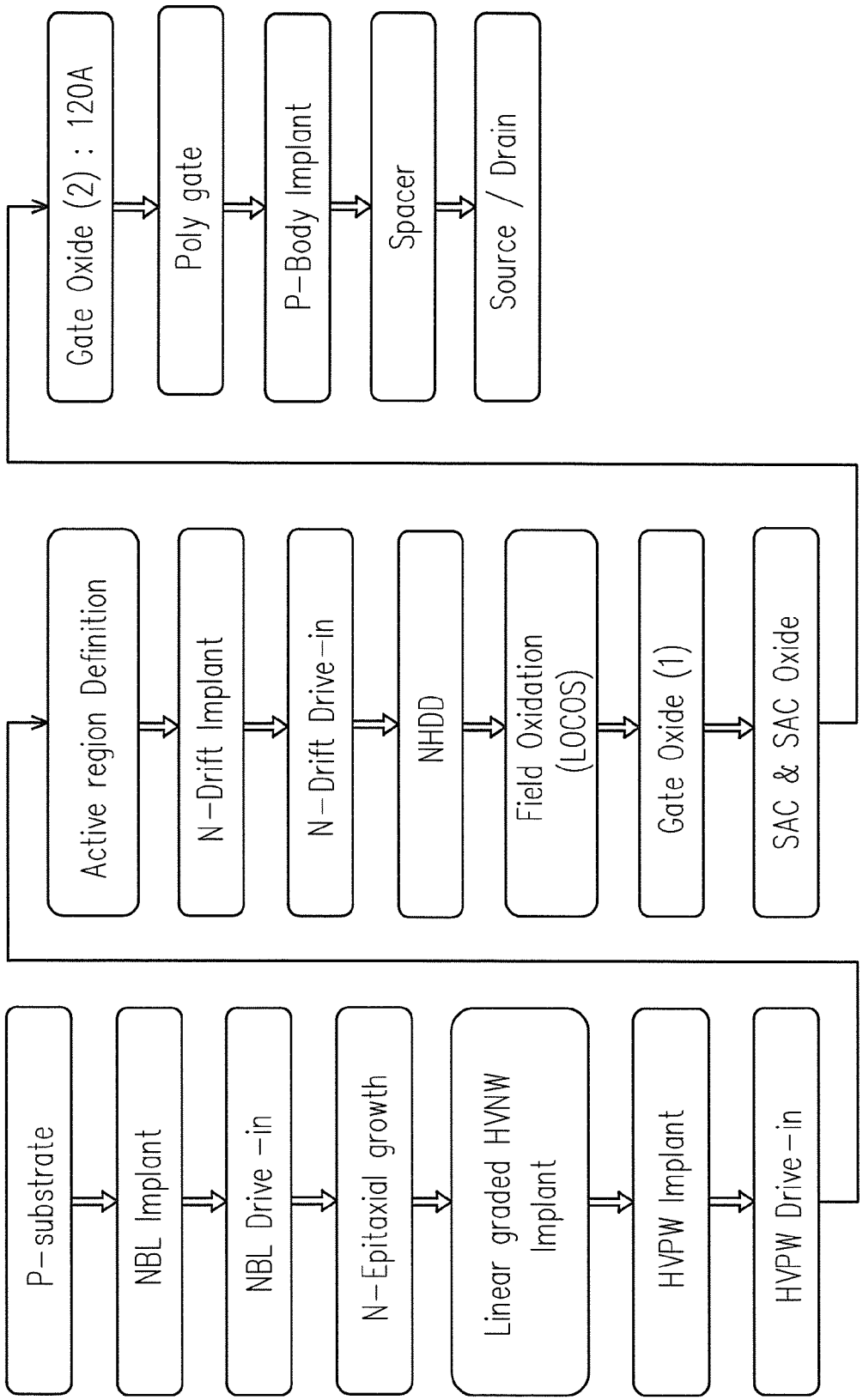
FIG. 3 is a flow chart of the manufacturing processes of a semiconductor device according to an embodiment of the invention.

FIG. 3 is a flow chart of part of the manufacturing processes of an NLDMOS device according to an embodiment of the invention. Referring to FIG. 3, after the ion implantation and drive-in of the N-type buried layer 160 are performed in the P-type substrate 100, the N-type epitaxial layer 102 is grown on the P-type substrate 100. The temperature of forming the N-type epitaxial layer 102 may be high, therefore, the N-type buried layer 160 may be diffused into the N-type epitaxial layer 102 to form the structure like FIG. 1 or 2. Then, the linear graded HVNW 140 and the HVPW 150 are formed within the N-type epitaxial layer 102 and adjacent to each other. It is understood that the linear graded HVNW 140 may be formed by using specially designed ion implanting mask (with multiple openings of varying pitches and dimensions) for ion implantation and followed by the drive-in or annealing process. After the ion implantation and drive-in of the HVPW 150, the active region(s) may be defined by nitride deposition. Afterwards, the N-type well 136 is formed within the linear graded HVNW 140 and the N-type HDD region 132 is formed within the N-type well 136. More specific, the thickness of the nitride can be adjusted to let the N-type well 136 and the N-type HDD region 132 be formed within the linear graded HVNW 140. Then, the isolation structures 170 and 172 may be formed by local oxidation of silicon (LOCOS) process respectively above the linear graded HVNW 140 and the HVPW 150.

Regarding the two-step gate oxide layer of the NLDMOS device 20, the second region 112b of the gate dielectric layer 112' may be formed by a first oxidation process (referring as gate oxide (1) process) over the P-type substrate 100. Then, a sacrificial oxide (SAC oxide) is formed on the surface of the NLDMOS device 20. The sacrificialoxide will be etched away later. This process is referred to as a sacrificial oxidation process and this process can let the surface smooth and make better performance of the NLDMOS device 20. Afterwards, the first region 112a of the gate dielectric layer 112' may be formed by a second oxidation process (referring as gate oxide (2) process) over the P-type substrate 100. The first region 112a and the second region 112b of the gate dielectric layer 112' are using different mask to form. After the gate 110 is deposited and P-type body region 124 is formed, the spacer 114 is formed on the sidewall of the gate 110, and then the source region 120 and the drain region 130 are respectively formed within the P-type body 124 and the N-type HDD region 132.

In another embodiment of the invention, only one oxidation process is performed for the single-step gate oxide layer of the gate 110 for the NLDMOS 10. In this embodiment, the gate oxide (1) process shown in FIG. 3 will be replaced by the gate oxide (2) process. Then, a SAC oxidation process can be performed. Afterwards, the gate 110 is deposited and P-type body region 124 is formed.

Based on the NLDMOS device 10 described in the previous embodiment of the present invention, the gate dielectric layer 112 of the NLDMOS device 10 is a single-step gate oxide layer. Based on the NLDMOS device 20 described in the previous embodiment of the present invention, the gate dielectric layer 112' of the NLDMOS device 20 is a double-step gate oxide layer having the first region 112a (from gate oxide (2) process) and the second region 112b (from the gate oxide (1) process). The length of the first region (i.e. gate oxide (2)) is x (μm), and the length of the field oxide 170' adjacent to the gate dielectric layer 112' is reduced toward the drain region 130. Different NLDMOS structures designed with or without linear graded HVNW, with full length N-buried layer (NBL) or pullback NBL and/or with single-step or two-step gate oxide layer are compared and the simulation results of their electrical properties, including off-state breakdown voltage (BV), on-resistance (Ron) and the isolation breakdown voltage (BV), are shown in Table 1.

TABLE 1

| No. of Sample | Off-state BV (V) | Ron (mΩ-mm$^2$) | Isolation BV (V) |
|---|---|---|---|
| Sample 1 (Structure without linear HVNW with pullback NBL& single-step gate oxide layer) | 111.63 | 201.66 | 54.40 |
| Sample 2 (Structure with linear HVNW and full length NBL & single-step gate oxide layer) | 88.02 | 234.10 | 384.38 |
| Sample 3 (Structure with linear HVNW and pullback NBL& single-step gate oxide layer) | 104.25 | 159.32 | 136.33 |

TABLE 1-continued

| No. of Sample | Off-state BV (V) | Ron (mΩ-mm$^2$) | Isolation BV (V) |
|---|---|---|---|
| Sample 4 (Structure without linear HVNW and with two-step gate oxide layer) | 109.91 | 221.65 | 54.4 |
| Sample 5 (Structure with linear HVNW and full length NBL & two-step gate oxide layer) | 86.17 | 259.58 | 384.43 |
| Sample 6 (Structure with linear HVNW and pullback NBL & two-step gate oxide layer) | 110.54 | 171.70 | 136.36 |

From the results of Table 1, it is shown that Samples 3 and 6, which are the structure(s) with the linear graded HVNW, have lower on-resistance (Ron), about 30~40% lower than Samples 1 and 4, which are the structures without the linear HVNW.

In the embodiment, it's found that the N-buried layer (NBL) of high-side NLDMOS structure not only prevents the breakdown between a source and the substrate when the device is in on-state, but also causes electric potential wires to be evenly distributed at a source terminal and a drain terminal when the device is in off-state. The full length NBL extends over the whole length of the P-type substrate, but the length of the pullback NBL ranges from around one fourth to a half of the whole length of the P-type substrate. In other embodiment, the length of the pullback NBL may be around three fourth of the length of the HVPW. In Table 1, it is shown that the structure(s) having the full length NBL has high isolation BV, while the structure(s) having the pullback NBL has much lower isolation BV.

Table 2 shows the simulation results of the gate structure having the double-step gate oxide layer.

TABLE 2

| Condition | Length x of Gate Oxide (2) (μm) | Dox reduction length (μm) | Off-state BV (V) | Ron (mΩ-mm$^2$) | Isolation BV (V) |
|---|---|---|---|---|---|
| #1 | 1.0 | — | 110.54 | 171.70 | 136.36 |
| #2 | 0.8 | −0.5 | 109.56 | 167.26 | 135.73 |
| #3 | 1.3 | −0.5 | 109.44 | 153.40 | 135.76 |

As shown in Table 2, three different lengths of gate oxide (2) are designed along with different reduced length of the field oxide (Dox reduction length), and the variations in off-state breakdown voltage (BV), on-resistance (Ron) and the isolation breakdown voltage (BV) are shown in Table 2. From the results of Table 2, the desirable off-state breakdown voltage (>100 V) and isolation breakdown voltage (comparable to 120 V) can be achieved for all three conditions #1-3. For the condition #3 of Table 2, when the length x of gate oxide (2) is 1.3 μm and the length of the field oxide is pulled back for 0.5 μm, the lowest possible Ron is obtained.

Figure 4:
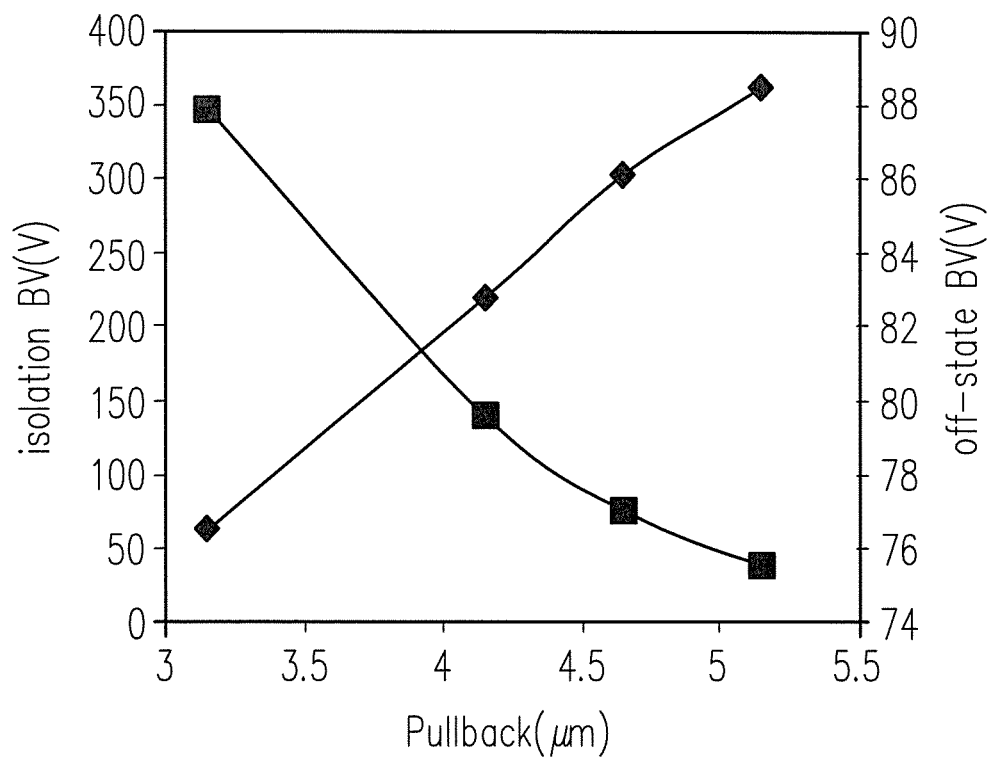
FIG. 4 is a diagram showing the relationship between the pull-back length of the NBL and the off-state and isolation breaking voltages according to an embodiment of the invention.

Referring back to the NLDMOS device 10 of FIG. 1, one side of the NBL 160 is pulled back with a pull-back length y in an embodiment of the present invention. Different pull-back lengths (For example: 3.15, 4.15, 4.65 or 5.15 μm) are applied and the simulation results with different pull-back lengths of the NBL 160, including the isolation BV, the off-state BV and Ron, are compared. FIG. 4 is a diagram showing the relationship between the pull-back length of the NBL and the off-state and isolation breaking voltages according to an embodiment of the invention.

Referring to FIG. 4, acceptable results are achieved for the pulled back NBL. The pulled-back length y is in the range of 3.15 μm to 5.15 μm, for example. For the NBL with a pull-back length of 4.15 μm, the isolation BV is about 139.88 V, the off-state BV is about 82.79 V and the Ron is about 135.29 mΩ-mm². Hence, the desirable isolation breakdown voltage and low on-resistance are obtained.

Based on the NLDMOS device 20 described in the previous embodiment of the present invention, the length x of the gate oxide (2) is 1.3 μm (obtained from Table 2) for the double-step gate oxide layer of the NLDMOS device 20. Different NLDMOS structures designed with or without linear graded HVNW and with full length N-buried layer (NBL) or pullback NBL are compared and the simulation results of their electrical properties are shown in Table 3.

TABLE 3

| Condition | Off-state BV (V) | Ron (mΩ-mm²) | Isolation BV (V) |
|---|---|---|---|
| Structure without linear HVNW and with two-step gate oxide layer | 111.10 | 191.72 | 54.31 |
| Structure with linear HVNW and full length NBL & two-step gate oxide layer | 87.94 | 219.40 | 384.42 |
| Structure with linear HVNW and pullback NBL & two-step gate oxide layer | 109.44 | 153.40 | 135.76 |

From the results of Table 3, it is shown that the structure(s) with the linear graded HVNW and pullback NBL has lower on-resistance (Ron) than that of the structure without the linear HVNW. Also, it is shown that the structure(s) having the full length NBL has much higher isolation BV, while the structure(s) having the pullback NBL has much lower isolation BV.

In general, the high-side NLDMOS structure described in the embodiments can be applied in the circuits or chips for motor driving, power supply management, flat-panel display driving and so on.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
a first conductive type epitaxial layer, disposed on a second conductive type substrate;
a high voltage second conductive type well, disposed within the first conductive type epitaxial layer;
a first conductive type buried layer, disposed within the first conductive type epitaxial layer and below the high voltage second conductive type well;
a source region, disposed within the high voltage second conductive type well;
a linear graded high voltage first conductive type well, disposed within the first conductive type epitaxial layer, wherein the linear graded high voltage first conductive type well is a doped region having a lateral linear doping profile that has a doping concentration gradually increases from a location nearest the first conductive type buried layer to a location farther from the first conductive type buried layer, and a length of the first conductive type buried layer is smaller than a length of the high voltage second conductive type well, wherein one side of the first conductive type buried layer is pulled back with a pull-back length, such that the first conductive type buried layer is spaced away from the linear graded high voltage first conductive type well for the pull-back length;
a drain region, disposed within the linear graded high voltage first conductive type well; and
a gate structure, disposed above the first conductive type epitaxial layer and disposed between the source region and the drain region.

2. The semiconductor device according to claim 1, further comprising at least two isolation structures disposed above the high voltage second conductive type well and the linear graded high voltage first conductive type well respectively.

3. The semiconductor device according to claim 1, wherein the linear graded high voltage first conductive type well is disposed alongside the high voltage second conductive type well.

4. The semiconductor device according to claim 1, wherein a depth of the linear graded high voltage first conductive type well at the location nearest the high voltage second conductive type well ranges from about 0.3 μm to about 0.7 μm, and the depth of the linear graded high voltage first conductive type well at the location farther from the high voltage second conductive type well and near the drain region ranges from about 1.0 μm to about 2.0 μm.

5. The semiconductor device according to claim 1, wherein the side of the linear graded high voltage first conductive type well with a higher doping concentration is deeper than the side of the linear graded high voltage first conductive type well with a lower doping concentration.

6. The semiconductor device according to claim 1, further comprising an first conductive type well disposed in the linear graded high voltage first conductive type well and a first conductive type heavily-doped drain region disposed within the first conductive type well, wherein the drain region is located within the first conductive type highly-doped drain region.

7. The semiconductor device according to claim 1, further comprising a second conductive type body region disposed within the high voltage second conductive type well and a second conductive type heavily-doped region disposed within the second conductive type body region and next to the source region.

8. The semiconductor device according to claim 1, wherein the source and drain regions are first conductive type heavily doped regions.

9. The semiconductor device according to claim 2, wherein the gate structure includes a gate and a gate dielectric layer located between the gate and the second conductive type substrate.

10. The semiconductor device according to claim 9, wherein the gate dielectric layer located between the gate and the second conductive type substrate is a silicon oxide layer having a uniform thickness, while a portion of the gate is disposed on one of the at least two isolation structures.

11. The semiconductor device according to claim 9, wherein a portion of the gate is disposed on one of the at least two isolation structures, the gate dielectric layer located between the gate and the second conductive type substrate is a silicon oxide layer having a first region of a smaller thickness and a second region having a larger thickness, and the second region is adjoining to the one of the at least two isolation structures.

12. The semiconductor device according to claim 11, wherein the first region is located above the second conductive type body region and the high voltage second conductive type well and near the source region, while the second region is located above the linear graded high voltage first conductive type well and near the drain region.

13. The semiconductor device according to claim 12, wherein a length of the first region ranges from about 0.8 μm to about 1.3 μm.

14. The semiconductor device according to claim 1, wherein the length of the first conductive type buried layer is shorter than the length of the high voltage second conductive type well for about 4.15 μm.

15. The semiconductor device according to claim 1, wherein a part of the first conductive type buried layer is disposed within the second conductive type substrate.

16. The semiconductor device according to claim 1, wherein the first conductive type is N-type, and the second conductive type is P-type, or wherein the first conductive type is P-type, and the second conductive type is N-type.

17. A semiconductor device, comprising:
a first conductive type epitaxial layer, disposed on a second conductive type substrate;
a high voltage second conductive type well, disposed within the first conductive type epitaxial layer;
a first conductive type buried layer, disposed within the first conductive type epitaxial layer and below the high voltage second conductive type well, wherein a length of the first conductive type buried layer is around three fourths of a length of the high voltage second conductive type well;
a source region, disposed within the high voltage second conductive type well;
a linear graded high voltage first conductive type well, disposed within the first conductive type epitaxial layer;
a drain region, disposed within the linear graded high voltage first conductive type well; and
a gate structure, disposed above the first conductive type epitaxial layer and disposed between the source region and the drain region.

18. The semiconductor device according to claim 17, wherein the length of the first conductive type buried layer is shorter than the length of the high voltage second conductive type well for about 4.15 μm.

19. The semiconductor device according to claim 17, wherein the gate structure includes a gate and a gate dielectric layer located between the gate and the second conductive type substrate, and the gate dielectric layer is a silicon oxide layer having a first region of a smaller thickness and a second region having a larger thickness.

20. The semiconductor device according to claim 1, wherein one side of the first conductive type buried layer is aligned with one side of the high voltage second conductive type well, and the other side of the first conductive type buried layer is pulled back with the pull-back length.

* * * * *